United States Patent
Minsek et al.

(10) Patent No.: US 6,824,952 B1
(45) Date of Patent: Nov. 30, 2004

(54) DEEP-UV ANTI-REFLECTIVE RESIST COMPOSITIONS

(75) Inventors: David W. Minsek, Pleasantville, NY (US); Daniel J. Nawrocki, Worcester, MA (US)

(73) Assignee: MicroChem Corp., Newton, MA (US)

( * ) Notice: Subject to any disclaimer, the term of this patent is extended or adjusted under 35 U.S.C. 154(b) by 298 days.

(21) Appl. No.: 09/951,718

(22) Filed: Sep. 13, 2001

(51) Int. Cl.$^7$ ................................................. G03C 1/72
(52) U.S. Cl. ................................ 430/270.1; 430/271.1; 430/320; 430/156
(58) Field of Search ................................ 430/270.1, 320, 430/271.1, 156

(56) References Cited

U.S. PATENT DOCUMENTS

| | | | |
|---|---|---|---|
| 2,146,209 A | | 2/1939 | De Witt Graves |
| 4,246,374 A | | 1/1981 | Kopchik |
| 4,521,121 A | | 6/1985 | Klein et al. |
| 4,524,121 A | | 6/1985 | Gleim et al. ............... 430/176 |
| 4,770,739 A | * | 9/1988 | Orvek et al. ............... 438/717 |
| 4,814,258 A | | 3/1989 | Tam |
| 4,910,122 A | | 3/1990 | Arnold et al. |
| 5,397,684 A | | 3/1995 | Hogan |
| 5,441,797 A | | 8/1995 | Hogan |
| 5,604,073 A | | 2/1997 | Krounbi et al. |
| 5,607,824 A | | 3/1997 | Fahey et al. |
| 5,654,376 A | | 8/1997 | Knors et al. |
| 5,736,301 A | | 4/1998 | Fahey et al. |
| 5,800,963 A | | 9/1998 | Knors et al. |
| 6,051,364 A | * | 4/2000 | Knors et al. ............. 430/271.1 |
| 6,395,449 B1 | * | 5/2002 | Hurditch et al. ......... 430/270.1 |
| 6,498,226 B2 | * | 12/2002 | Cheng et al. ............... 528/170 |
| 6,586,560 B1 | * | 7/2003 | Chen et al. ................. 528/310 |

FOREIGN PATENT DOCUMENTS

EP 0341843 11/1989

OTHER PUBLICATIONS

"Polyimide containing an acetal structure with a photoacid generator: a novel positive polyimide photoresist"., Akimoto et al. High Performance Polymer 12, (2000) 185–195. □□.*
"Fluorine containing poly(amide–imide)s: synthesisand formation of Langmuir–Blodgett monolayers".,(abstract) Onah et al. European Polymer Journal (2002) Volume Date 2003 39(1), 127–134.*

* cited by examiner

*Primary Examiner*—Yvette C. Thornton
(74) *Attorney, Agent, or Firm*—Wiggin and Dana LLP; William A. Simons; Elizabeth Geschke

(57) ABSTRACT

A composition useful as a lift-off resist comprising at least one solvent, at least one polydimethylglutarimide (PMGI) resin and at least one selected deep-UV absorbing molecule of Formula I, where X is an aromatic or aliphatic bridging group, and Ar and Ar' are aryl groups wherein at least one Ar or Ar' contains one or more hydroxyl or carboxylic acid groups

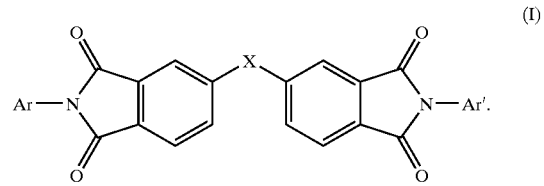

(I)

18 Claims, No Drawings

DEEP-UV ANTI-REFLECTIVE RESIST COMPOSITIONS

BACKGROUND OF THE INVENTION

1. Field of the Invention

The present invention relates to selected resist compositions useful as the lower release layer or lift-off resist in a bilayer metal lift-off photoresist process or as base-soluble anti-reflective coating for conventional lithographic applications. In particular, this invention relates to specific coating compositions useful for the bottom layer for these uses, that include at least one solvent, at least one polydimethylglutarimide (PMGI) resin and at least one selected deep-ultraviolet (DUV) absorbing additive. More specifically, this resist composition comprising a mixture of one or more selected light-absorbing additives that when mixed with PMGI reduces the amplitude of standing waves caused by reflected light and prevents intermixing in a bilayer photoresist system, while maintaining a controllable dissolution rate in aqueous alkali developer in order to obtain a predetermined degree of undercut.

2. Brief Description of Art

The Lift-off process is the name used to describe the process in which photolithography is used to form a relief pattern on a substrate in a light sensitive thin film such as a photoresist, followed by blanket deposition of a metal layer such that the metal is deposited onto the substrate in regions that are uncovered by photoresist, followed by removal of the photoresist and excess metal by wet methods. The most widely used lift-off processes involve a bilayer lithographic process (sometimes referred to as a bilevel process). Such bilayer lift-off processes have been used to fabricate the metallic "read stripe" in the manufacture of thin film heads for magnetic hard drives and in the fabrication of the gate oxide for gallium arsenide field effect transistor (FET) devices. Variants of these bilayer lift-off processes are described in detail in European Patent Application No. 0341843 (assigned to International Business Machines Inc.) and U.S. Pat. No. 4,814,258 (assigned to Motorola, Inc.).

In bilayer lift-off processes, a solution of a non-photoimagable lift-off resist (LOR) is first deposited by spin-coating to form a uniform thin film on top of the substrate to be metallized. Lift-off processes have been described in detail by W. Moreau, in *Semiconductor Lithography, Principles, Practices, and Materials* (Plenum Press, New York, N.Y., 1988), Chapter 12. After application by spin-coating, the LOR layer is then soft-baked by heating at a sufficiently high temperature to remove most of the solvent contained in it. A conventional photo imaging photoresist layer is then deposited by spin-coating on top of the LOR followed by a soft-bake to evaporate most of the solvent, leaving a solid uniform coating. Especially for lift-off applications in which high resolution features must be delineated, it is essential that no intermixing occurs between the LOR and the top photoresist. Therefore, the LOR layer should have low solubility in the solvent system used to formulate the top photoresist. A pattern is then transferred from a mask to the top resist film by patterned radiation using a conventional photolithographic imaging process such as contact, proximity, or projection printing. For a positive resist, which is made soluble by exposure to visible or ultraviolet radiation, the exposed regions are dissolved away by the developer, yielding a positive image of the photomask. This in turn exposes the LOR layer to developer in these regions, which then dissolves both vertically through to the substrate and laterally to penetrate a small predefined distance into the adjacent unexposed areas of the photoresist layer. This lateral dissolution produces a controlled degree of undercut in a development time which is neither too long to remove too much unexposed photoresist, or too short to make the process irreproducible. In any practical bilayer lift-off process, it is desirable to adjust and maintain precise control of the dissolution rate of the lift-off resist layer, so that the required degree of undercut is always obtained in a relatively short time using an aqueous alkaline developer which is compatible with, and provides a wide process latitude for the positive photoresist imaging layer.

There is a need for high resolution lithographic patterning as the critical dimension in device manufacture becomes smaller. Although traditionally the g-line (436 nm), h-line (404 nm), and i-line (365 nm) of the mercury lamp output have been used in bilayer lift-off lithography, there is a motivation to utilize D-UV radiation, typically below 300 nm, which allows higher resolution patterning since the diffraction-limited resolution increases approximately linearly with decrease in wavelength. It is especially useful to provide absorption at the wavelength 248 nm of a krypton fluoride (KrF) laser, which is widely used in DUV lithography.

It is widely known that in thin films propagating waves and reflected waves can produce standing waves through interference effects. The amplitude of these standing waves depends on the reflectivity, the wavelength of the radiation and the thickness of the films. Standing waves result in varying light intensity in the resist film, which depends critically on the thickness of the resist layer, and the underlying substrate topography, all of which vary in practice, thus reducing the process latitude. The amplitude of standing waves is high when the reflectivity of the bottom substrate is high, as is the case for most metals, silicon, and GaAs. Furthermore the reflectivity tends to increase with decrease in wavelength. It is therefore desirable to increase the absorption of the LOR, especially if the LOR is used in DUV lithography, such that a thin film will reduce the intensity of the reflected light and hence suppress the standing waves in a manner similar to that used in conventional lithography by utilizing a highly absorbing anti-reflective coating.

Partially or fully imidized acrylic polymers referred to as polydimethylglutarimides or PMGI resins which are suitable for use as the bottom resist layer in a lift-off process have been described in U.S. Pat. No. 4,524,121 (assigned to Rohm and Haas Co.). PMGI resins are manufactured commercially by the process described in U.S. Pat. No. 4,246,374 (assigned to Rohm and Haas). In this process, poly (methyl methacrylate) (PMMA) having a weight-average molecular weight ($M_w$) of about 70,000 to 110,000 is partially imidized with ammonia gas in an extruder at high pressure and relatively high temperature such that the resulting polymer contains about 65–80% of imidized methacrylate moieties, the nitrogen atoms of which bear either a methyl group (N—Me) or hydrogen (N—H). The percentage of (N—H) groups determines the alkaline solubility. And is typically about 65–80%. PMGI resins produced by this process have negligible optical absorbance at actinic wavelengths and a fairly narrow range of alkaline solubility. This limitation creates the need for other methods of modifying the absorbance and concurrently controlling the dissolution rate of PMGI for critical high resolution applications in lift off processes such as those using DUV lithography.

Radiation absorbers which are suitable for use in anti-reflective coatings or as additives to photoresists may not be suitable for use in bilayer lift-off applications because of the different requirements. In particular, it is especially difficult to select an absorber which can be added to an LOR at a concentration sufficiently high to provide high absorbance, yet capable of meeting the processing requirements described above, namely (1) insoluble in resist solvent, (2) soluble in a resist developer, and (3) non-chemically reactive towards the photoresist. The absorber must also be non-subliming or non-volatizing at high temperatures, miscible with PMGI polymer, and must not dissolve in or leach into positive photoresist, which is typically used as the imaging layer.

Several approaches have been taken to solve these problems, including the following:

The addition of an non-actinic wavelength absorbing dye to a PMGI resin in a bilayer lift-off process is disclosed in U.S. Pat. No. 5,604,073 assigned to International Business Machines Corp. The dye described in this patent is a mono-azo dye, which improves the adhesion properties of the PMGI release layer to the substrate. However, the use of a light-absorbing molecule specifically to reduce the amplitude of standing waves was not disclosed and the wavelengths at which the disclosed dye has strong absorption does not extend below 300 nm.

U.S. Pat. Nos. 5,607,824; 5,654,376 and 5,800,963 assigned to International Business Machines Corp. disclose the grafting of dyes onto polymaleic anhydride vinylether copolymers for use as anti-reflective coatings at exposure wavelengths of 365 nm. However, such materials are unsuitable for use as lift-off layers due to insolubility in aqueous base developers.

U.S. Pat. Nos. 5,397,684 and 5,441,797 assigned to International Business Machines Corp. disclose an anti-reflective, thermally stable polyimide dielectric layer for a bilayer photolithographic process using 405 nm or 436 nm light. However, the underlayer was not soluble in aqueous base developer and therefore not suitable as a release layer.

U.S. Pat. No. 5,736,301 (assigned to International Business Machines Corp.) discloses a method for patterning a photoresist using 248 nm radiation, where a copolymer of benzophenone and bisphenol A is used as an anti-reflective coating. However, such materials are unsuitable for use as lift-off layers due to insolubility in aqueous base developers.

U.S. Pat. No. 4,910,122 (assigned to Brewer Science, Inc.) discloses anti-reflective coatings consisting of polyamic acids with the addition of radiation absorbing dye molecules. The polyamic acid coating may be made non-intermixing with photoresist by converting to polyimides by baking at temperatures of at least 148° C. for 30 minutes. Although the polyimide coating is soluble in aqueous base developer, the dissolution rate is known to be highly sensitive to bake conditions. Moreover, neither the use of such coatings specifically as lift-off layers nor the use of deep-UV absorbing dyes was disclosed.

Accordingly, a need still exists for lift-off resist compositions that have good absorbance characteristics in the deep-UV spectrum while satisfying a number of processing requirements. The present invention offers a solution to that need.

BRIEF SUMMARY OF THE INVENTION

Therefore, one aspect of the present invention is directed to specific compositions useful for the bottom planarization layer, that include at least one solvent, at least one polydimethylglutarimide (PMGI) resin and at least one selected deep-UV absorbing additive which is a compound or mixture of compounds of the structure shown in Formula I, where X is an aromatic or aliphatic bridging group, and Ar and Ar' are aryl groups wherein at least one of Ar or Ar' contains one or more hydroxy or carboxylic acid groups.

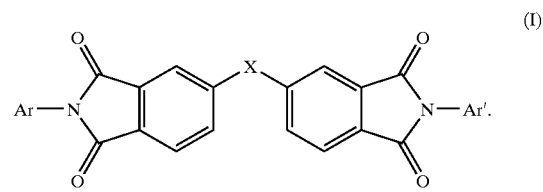

The compound of Formula (I) when mixed with PMGI does not cause an intermixed layer to form between the bottom layer and the upper layer of the bi-layer photoresist, while maintaining a controlled dissolution rate in aqueous alkali developer in order to control the degree of undercut. Another aspect of the present invention relates to selected resist coating compositions useful as the lower release layer in a bilayer metal lift-off photoresist process or as base soluble anti-reflective coating for conventional lithographic applications.

Yet another aspect of the present invention is directed to composite articles which comprise (1) a microelectronic substrate; (2) a layer of lift-off resist (LOR) as described above lying on top of the substrate; and (3) a layer of positive-imaging photoresist lying on top of the layer of lift-off resist.

It is an advantage of the present invention to provide DUV absorbing additives which are soluble in solvents suitable for dissolving PMGI resins, are miscible with PMGI over a wide composition range, do not impair the film-forming characteristics of the lift-off resist, have melting points which are sufficiently high, are not subliming and do not decompose or volatilize upon heating at the maximum temperature used in the application.

Another advantage of the present invention is that the dissolution rate and hence undercut rate of an LOR layer can be increased or decreased while maintaining a relatively high value of the DUV absorbance required for the effective suppression of standing waves.

Still another advantage is that a more aggressive TMAH-containing developer, which is compatible with advanced positive resists frequently used for sub-micron photolithographic processes, may be used.

DETAILED DESCRIPTION OF THE INVENTION

The present invention relates to selected compositions useful as a release layer in a bi-layer lift-off photoresist process. In particular, this invention relates to specific compositions useful for the bottom layer, that include at least one solvent, at least one polydimethylglutarimide (PMGI) resin and at least one selected deep-U-V absorbing compound or mixture of compounds of structure shown in Formula (1) above.

Examples of such DUV radiation absorbing compounds are given below as A—O:

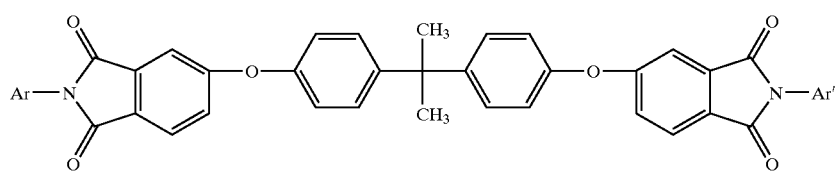
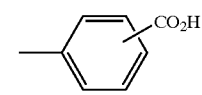
where Ar and Ar' are aryl groups. Examples of such are given below as formulae P—X. At least one of these Ar and Ar' are aryl groups containing one or more hydroxy or carboxylic group. Examples of such are given below as formulae P—S.

-continued

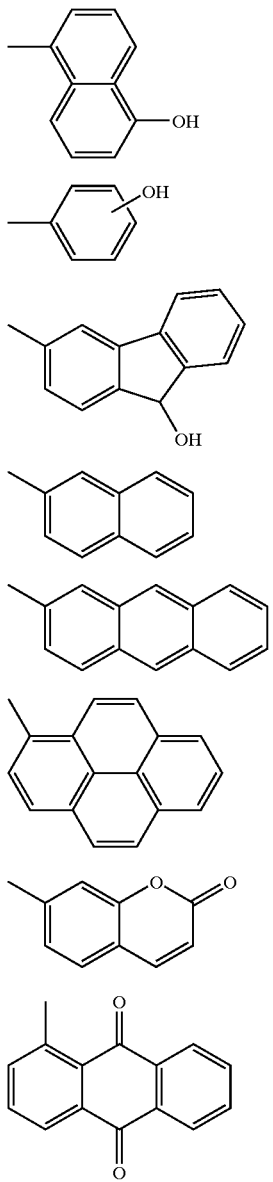

(Q)
(R)
(S)
(T)
(U)
(V)
(W)
(X)

Other examples will be apparent to those skilled in the art.

A formulation comprising a mixture of a compound of Formula (I), PMGI resin and a suitable solvent may be spin-coated onto a substrate and baked to evaporate residual solvent, leaving a layer of solid coating. The coating prevents an intermixed layer from forming between itself and the upper layer of the bilayer photoresist, while a controllable dissolution rate in aqueous alkali developer is maintained in order to determine the degree of undercut. Furthermore, the light-absorbing medium comprising the bottom layer prevents the formation of standing waves caused by reflected light at wavelengths in the DUV range.

PMGI pre-formed polymers supplied commercially by Rohm and Haas for use in photoresists, containing about 65–80 mole % of imide moieties, and having a ratio of N—H vs N-methyl bonds of about 5:5 to about 7:3, preferably about 6:4, and a glass transition temperature of about 190–195° C. are most useful. The weight average molecular weight ($M_w$) of the standard PMGI resin is typically in the range 70,00–110,000 grams/mole and can be reduced by pre-exposing the solid resin to electron beam radiation of about 30–70 MRads. The reduction in molecular weight depends on the total amount of energy absorbed by the resin. The preferred molecular weights are selected on the basis of the dissolution rate of the resin in a standard developer. For the standard high molecular weight resin, the preferred weight average molecular weight is 70,000–90,000. For the pre-exposed low molecular weight resin the preferred molecular weight range is about 17,000–30,000.

Suitable solvents useful for PMGI and the compounds of the present invention include polar amide solvents such as dimethylformamide and N-methyl pyrollidone, ketonic solvents such as cyclopentanone, 2-pentanone and 2,4-pentanedione, cyclic ethers such as 1,3-dioxolane and tetrahydrofuran, cyclic keto-ethers such as gamma-butyrolactone, hydroxylic polar solvents such as tetrahydrofurfuryl alcohol; and mixtures of the above.

Any one or more of the above solvents may be combined with other solvents which alone may not dissolve PMGI such as ethyl lactate, propyleneglycolmethylether, propyleneglycolmethylether acetate, methylamyl ketone, cyclohexanone, methylmethoxy propionate, ethylethoxypropionate and the like.

Preferred solvent systems are those which give uniform striation-free, pinhole free coatings, and are mixtures are cyclopentanone/propyleneglycolmethyl ether, cyclopentanone/N-methyl pyrollidone, and cyclopentanone/tetrahydrofurfuryl alcohol in which the cyclopentanone comprises more than about 70% by weight of the mixed solvents.

Optionally, an additive may be included which serves to accelerate the dissolution rate of the coated film consisting of said formulation in an aqueous alkali developer. The major requirements for a dissolution rate enhancer are that the material (i) form a homogeneous phase with the PMGI resin, DUV-absorbing additive, and solvent, (ii) be non-subliming especially during a bake step at elevated temperatures, and (iii) does not cause a layer of scum to form during and after a development step in aqueous alkali developer. Suitable dissolution rate accelerators include, but are not limited to, di-, tri-, tetra-, penta- or hexa-hydroxybenzophenones, or polymeric materials such as cresol-formaldehyde novolaks, polyhydroxystyrenes and the like.

Other additives, well known to those skilled in the art, which may be optionally used to improve the coating quality of a spin-coating resist formulation include leveling agents, wetting agents and adhesion promoters.

The LOR solution is formed by dissolving the PMGI resin, a DUV-absorbing additive of the present invention comprising a compound or mixture of compounds of Formula (I), and other additives if used in the selected coating solvent system. The resin is typically dissolved in the solvent system to a concentration of about 2 to 20 weight percent. The DUV-absorbing additive is preferably added in an amount of about 20 to 55% of the total solids present in the solution. The solution is filtered through a polypropylene or Teflon filter to remove particulate matter. The LOR layer is formed by spin-coating the LOR solution onto a substrate to form a uniform layer of thickness of about 250 to about 10,000 Angstroms, preferably about 500–5,000 Angstroms. The substrate materials are typically gallium arsenide, indium phosphide, silicon, silicon germanium or ceramic which may have deposited on their surface other materials such as silicon oxide, silicon nitride, various metals, or alloys of NiFe. The LOR layer is soft-baked by heating on a hot-plate or in a convection oven to a temperature of 140–200° C. and preferably from 150–170° C.

The imaging photoresist layer is deposited on top of the LOR layer to a uniform thickness of about 0.5 to 1.5 microns. The imaging photoresist is usually a commercial positive resist of the type commonly used in the manufacture of semiconductor devices, either of the conventional used novolak-diazonaphthoquinone or chemically amplified type. The top imaging photoresist layer must not intermix with the imaging resist layer.

The photoresist layer is exposed through a photomask containing the pattern to be transferred. The resist layer is soft-baked by heating to a temperature of 90–130° C. to remove most of the residual solvent, the pattern is transferred from a mask to the resist film using a conventional microlithographic imaging tool such as a contact and proximity printer or a stepper or a projection stepper.

The exposing radiation is in the wavelength range 200–300 nm and may comprise a broad band or a narrow band, depending on the type of imaging tool required to a transfer an image of the pattern on the photomask at the desired resolution. Narrow wavelength bands corresponding to the spectral output of a mercury or mercury-xenon lamp or an excimer laser. A preferred narrow band is 248 nm.

Suitable developers are commercially available aqueous alkaline developers such as tetramethyl ammonium hydroxide, and metal ion containing such as sodium hydroxide, potassium hydroxide, potassium carbonate and the like. A preferred developer composition contains 2.38% tetramethyl ammonium hydroxide in deionized (DI) water to which a surfactant may be added. Preferred commercial developers are NMD-3, Shipley LDD26W and AZ 400 diluted 1:4 with DI water.

The present invention is further described in detail by means of the following Examples and Comparisons. All parts and percentages are by weight and all temperatures are degrees Celsius unless explicitly stated otherwise.

EXAMPLES

Preliminary Determination of the Rate of Undercut and Propensity to Scum

A first non-imaging resist layer of a liftoff resist (LOR) of the present invention was deposited as follows. A uniform coating of the solution to be tested, of approximately 1000 Angstroms in thickness was deposited onto a silicon wafer by spin coating at a final speed of 3000 rpm for 30 seconds. The coated wafer was soft-baked on a hot plate at either 165° C. or 175° C. for 3 minutes. The film thickness was determined using a Nanospec thin film reflective interferometric microscope.

A second top photoresist layer (imaging layer) was deposited as follows: A uniform coating of approximately 1.2 micron thickness of Shipley S1818 positive resist, or 0.6 micron of Sumitomo PF181 A7 positive resist was deposited by spin-coating on top of the of the first layer. The coated wafer was soft-baked on a hotplate at 115° C. for 1 minute. The coating was examined for the presence intermixing which results in an interference pattern, having the appearance of circular bands radiating from the center of the substrate, which is easily observed by viewing the coated substrate in reflection under a narrow band visible light source. The wafer was then placed in proximity to a resolution mask comprising an array of square features having a range of dimensions in the range of 2 to 20 microns, and exposed for a predetermined time to a collimated light beam produced from a Mercury Xenon light source providing continuous radiation in the range of wavelengths 330–450 nm. The exposure time was that required to replicate the dimensions of the mask features in the developed resist film.

The rate of undercut in the LOR layer occurring during development of the latent image formed upon exposure of the top photoresist layer was determined as follows. The wafer was placed in a clean petri-dish and 50 ml of Shipley LDD26W developer (comprising 2.38% of tetramethylammonium hydroxide plus a surfactant in deionized water) was added. The wafer was removed from the developer after about 30 seconds, rinsed with deionized water and blown dry with $N_2$ gas. The wafer was then inspected under a light microscope, and the 20 micron features studied to determine visually if 1 micron of undercut in the lower resist layer had been achieved. If 1 micron had not been achieved, the wafer was placed back into the petri-dish and removed after a further period of time and repeatedly thereafter, at approximately 15 seconds to 5 minute intervals depending upon the dissolution rate, which was typically in the range from 0.03 to 2 microns per minute. The total accumulated development time required to attain 1 micron of undercut was determined. The whole process was repeated without intermittently stopping the development, and the time for 1 micron undercut was determined and compared with the result obtained with intermittent development. If the results were within agreement by 10%, the value reported was that obtained with continual development. If the results differed by more than 10% the process was repeated until two consecutive results agreed within 10%.

Scum was determined to be present in the undercut region if the side-walls of the imaged squares were surrounded by hazy rather than a clear area of undercut or in the case of severe scumming by a mass of particulates.

Experimental Procedure Used to Determine the Imaginary Part of the LOR Film Refractive Index, k.

An LOR composition prepared as described above was spin-coated onto a quartz glass substrate using the same spin-coat conditions as used to coat the LOR layer onto a silicon substrate. The absorbance $A_\lambda$, at a selected actinic wavelength $\lambda$, was measured using a Perkin Elimer Lambda 20 spectrometer with an uncoated borosilicate substrate or quartz substrate placed in the reference beam. The thickness, d, of the film was assumed to be the same as that determined on a silicon substrate by means of the Nanospec reflective interferometer. The imaginary part of the refractive index, $k_\lambda$) was calculated using the well-known formula:

$$k_\lambda = 2.303 A_\lambda (\lambda/4\pi d)$$

Example 1 (Synthesis)

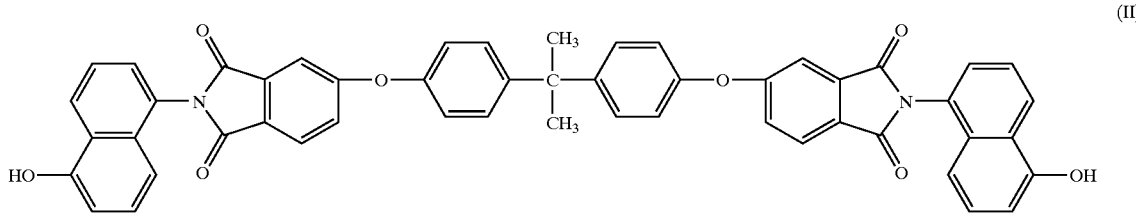

(II)

4,4'-(4,4'-isopropylidenediphenoxy)-bis-(N-(5-hydroxy-1-naphthyl)-phthalimide) (II).

4,4'-(4,4'-isopropylidenediphenoxy)-bis-(N-(5-hydroxy-1-naphthyl)-phthalimide) (Formula (II)) was prepared by adding 4.73 gram 5-amino-1-naphthol to 7.74 gram 4,4'-(4,4'-isopropylidenediphenoxy)bis(phthalic anhydride) dissolved in 27.6 gram dimethylformamide. After stirring at room temperature for 12 hours the solution was heated to 150° C. for 2 hours to complete the imidization reaction. The product was precipitated by pouring into de-ionized water, filtered and dried. The structure shown (II) was confirmed by proton nuclear magnetic resonance spectroscopy. Purity was estimated at about 80% by high pressure liquid chromatography (HPLC). The solution absorption spectrum in tetrahydrofuran showed an absorption maximum of 239 nm with a molar extinction coefficient of about 95,000 $(M/L)^{-1}$ $cm^{-1}$.

Example 2 (Synthesis)

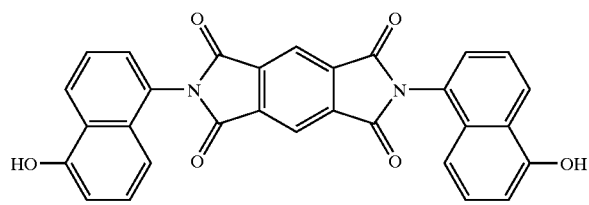

(III)

Bis-(N-(5-hydroxy-1-naphthyl) pyromellitic diimide (III).

Bis-(N-(5-hydroxy-1-naphthyl) pyromellitic diimide (Formula (III)) was prepared as follows: 7.4 gram pyromellitic dianhydride was dissolved in 75 mL dimethylformamide and cooled in an ice water bath; 10.8 grams 5-amino-1-naphthol dissolved in 25 mL dimethylformamide was added dropwise. After complete addition the solution was allowed to warm to room temperature. After stirring at room temperature for 12 hours a condensor was attached and the solution was heated to reflux, and solvent was distilled until 75 mL was collected. After cooling to room temperature, the product was precipitated by pouring into de-ionized water, filtered and dried under vacuum. The structure shown (III) was confirmed by proton nuclear magnetic resonance spectroscopy. Purity was estimated at about 80% by high pressure liquid chromatography (HPLC). The solution absorption spectrum in tetrahydrofuran showed an absorption maximum of 239 nm with a molar extinction coefficient of about 99,000 $(M/L)^{-1}$ $cm^{-1}$.

Example 3 (Synthesis)

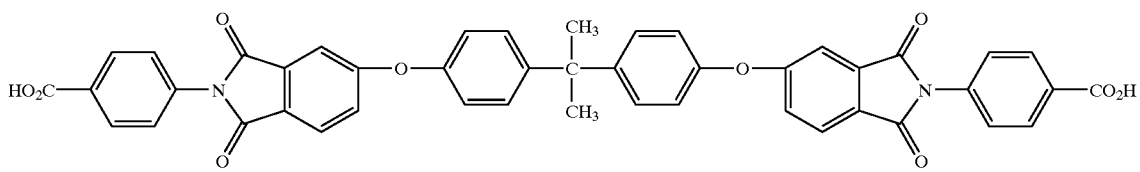

(IV)

4,4'-(4,4'-isopropylidenediphenoxy)-bis-(N(4-carboxyphenyl-)phthalimide) (IV).

4,4'-(4,4'-isopropylidenediphenoxy)-bis-N-(4-carboxyphenyl)-phthalimide) (Formula (IV)) was prepared by adding 9.9 grams 4-aminobenzoic acid dissolved in 75 mL dimethylacetamide to 18.75 grams 4,4'-(4,4'-isopropylidenediphenoxy)bis(phthalic anhydride) previously dissolved in 125 mL cyclopentanone. After stirring at room temperature for 3 hours the solution was heated to reflux, a distillation head was attached and solvent was distilled until 175 mL was collected. After cooling to room temperature, the product was precipitated by pouring into de-ionized water, filtered and dried under vacuum. The structure shown as Formula (IV) was confirmed by proton nuclear magnetic resonance spectroscopy. Purity was estimated at about 80% by high pressure liquid chromatography (HPLC). The solution absorption spectrum in tetrahydrofuran showed an absorption maximum of 256 nm with a molar extinction coefficient of about 40,000 $(M/L)^{-1}$ $cm^{-1}$.

Example 4

A solution was prepared by mixing 13.6 grams of the compound of Formula (II) of Syntheses Example 1, 27.3 grams PMGI resin having a weight average molecular weight ($M_w$) of about 20,000 grams/mole and 472.7 grams of a solvent mixture consisting of 85% cyclopentanone and 15% propyleneglycolmethylether. After filtering through a PTFE filter with 0.2 micron pore size the solution was spin-coated onto a substrate at 3000 rpm and soft-baked at 185° C. for 5 minutes, yielding a solid coating with a thickness of 5019 Angstroms. Using the procedure described above, a value of $k_\lambda$=0.16 was measured from the optical absorbance at $\lambda$=248 nm.

A top photoresist PF188A7 supplied by Sumitomo Chemicals was applied by spincoating at 4000 rpm for 30 seconds, followed by baking on a hotplate at 115° C. for 60 seconds. The film thickness was determined to be about 7000 Angstroms. The sample was exposed to radiation from a mercury light source through a photomask using a contact exposure tool. This was followed by development by immersion in Shipley LDD26W developer, consisting of 0.26 N tetramethylammonium hydroxide containing a surfactant. Using the method described above, the total development time required to attain an undercut distance of one micron in the LOR layer (measured from the bottom edge of the top resist) was determined to be 7 minutes and the undercut region was free from scum or residues.

Example 5

The method according to Example 4 was repeated except that the compound of Formula (II) of Syntheses Example 1, was present in an amount of 27.3 grams and the PMGI resin was present in an amount of 27.3 grams. The film thickness of the spin-coated film was determined to be 4707 Angstroms. A value of $k_\lambda=0.24$ was measured from the optical absorbance at $\lambda=248$ nm. The time required to attain an undercut of one micron was determined to be 15 minutes and the undercut region was free from scum or residues.

Example 6

The method according to Example 4 was repeated except that the compound of Formula (II) of Syntheses Example 1, was present in an amount of 30 grams and the PMGI resin was present in an amount of 30 gms and a speed enhancing additive 2,3,4,3',4',5'-hexaxydroxybenzophenone was present in an amount of 2.55 gms. The film thickness of the spin-coated film was determined to be 6860 angstroms. A value of $k_{\lambda=}0.24$ was measured from the optical absorbance at $\lambda=248$ nm. The time required to attain an undercut of one micron was determined to be 5 minutes and the undercut region was free from scum or residues.

Example 7

The method according to Example 4 was repeated except that the compound of Formula (III) of Syntheses Example 2, was present in an amount of 13.6 grams and the PMGI resin was present in an amount of 27.3 grams. The film thickness of the spin-coated film was determined to be 4476 Angstroms. A value of $k_\lambda=0.14$ was measured from the optical absorbance at $\lambda=248$ nm. The undercut section was free of scum or residues.

Example 8 (Predictive)

The lift-off resist solution from Example 5 is spin coated onto a silicon wafer and baked on a hotplate at 185° C. for 5 minutes to remove solvent, producing a coating of about 4700 Angstroms thickness. A top chemically amplified DUV resist such as TOK TDUR501 is applied by spin coating at 4000 rpm for 30 seconds, followed by baking on a hotplate at a temperature sufficiently low to prevent thermal decomposition, but sufficiently high to evaporate solvent. The bilayer resist is exposed to patterned radiation at a wavelength of 248 nm through a photomask using either a KrF excimer laser source or the deep ultraviolet portion of the mercury lamp spectral output, i.e. from 200–300 nm wavelength. If necessary, the exposed wafer may be post-exposure-baked at a temperature sufficient to complete a thermal reaction, then developed by immersion in an aqueous alkali developer, such as tetramethylammonium hydroxide in water, Shipley CD26, LDD26W or JSR PD523. The extent of undercut as measured as described above is predicted to be about 0.05 to 0.07 microns for one minute of development time based on the results of Example 8. Additionally, it may be predicted that the amplitude of the standing waves will be significantly reduced relative to a comparative example where the bottom layer does not contain the radiation-absorbing compound.

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. AU patent applications, patents and other publications cited herein are incorporated by reference in their entirety.

What is claimed is:

1. A composition useful as a lift-off resist comprising at least one solvent, at least one polydimethylglutarimide (PMGI) resin and at least one selected deep-UV absorbing molecule of formulae I, or G through O:

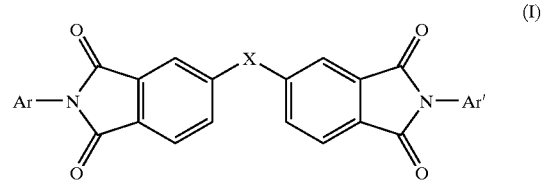

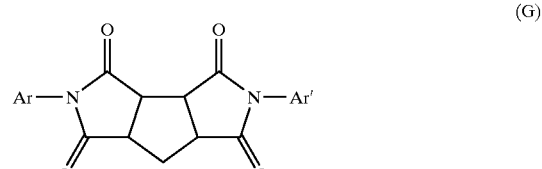

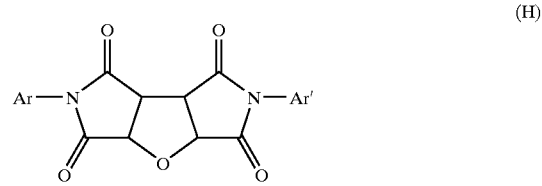

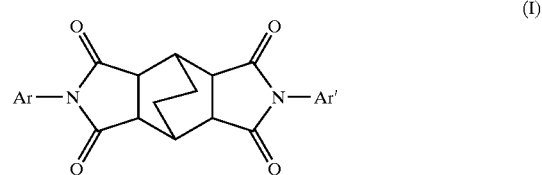

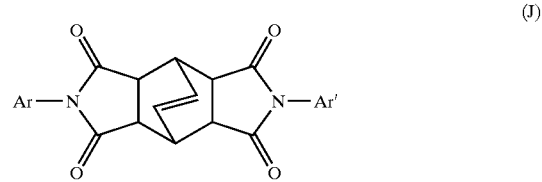

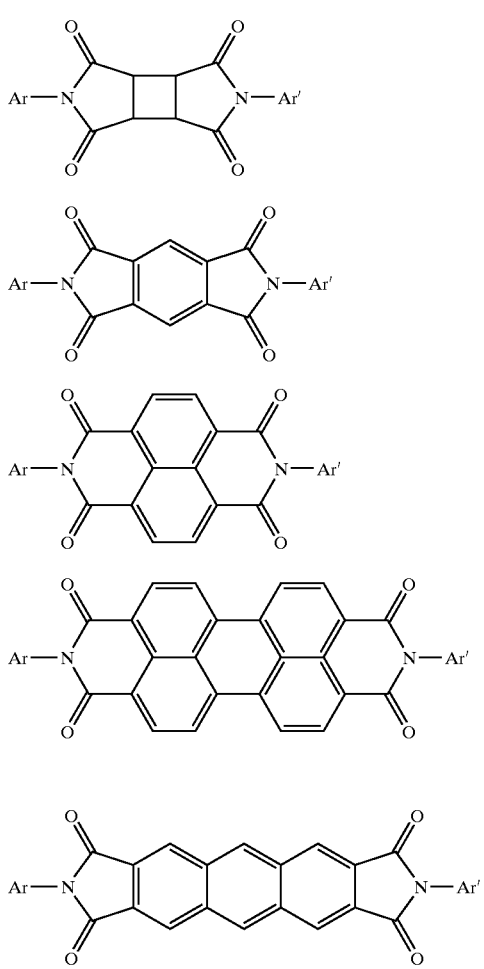

wherein X is selected from the group consisting of an aromatic group, an aliphatic group, a C=O, a single bond, —O—, —S—, and —S(O$_2$)—; and wherein Ar and Ar' are aryl groups wherein at least one Ar or Ar' contains one or more hydroxyl or carboxylic acid groups.

2. The composition of claim 1 wherein the solvent is selected from the group consisting of polar amide solvents, ketonic solvents, cyclic ether solvents, cyclic keto-ether solvents and hydroxylic polar solvents and mixtures thereof.

3. The composition of claim 1 wherein the solvent is selected from the group consisting of dimethylformamide, N-methyl pyrollidone, cyclopentanone, 2-pentanone, 2,4-pentanedione, 1,3-dioxolane, tetrahydrofuran, gamma-butyrolactone, tetrahydrofurfuryl alcohol and mixtures thereof.

4. The composition of claim 1 wherein the solvent is a mixture of cyclopentanone with either propyleneglycolmethyl ether or tetrahydrofurfuryl alcohol, or N-methyl pyrollidone in which the cyclopentanone comprises more than about 70% by weight of the solvent.

5. The composition of claim 1 wherein the polydimethylglutarimide resin contains 65–80% of imide moreties, has a ratio of N—H vs. N-methyl bonds of about 1:1 to 7:3 and a glass transition temperature of about 180–195° C.

6. The composition of claim 1 wherein Ar and Ar' are selected from the groups defined by formulae P to X:

7. The composition of claim 1 the deep-UV absorbing compound is 4,4'-(4,4'-isopropylidenediphenoxy)-bis-(N-(5-hydroxy-1-naphthyl)-phthalimide).

8. The composition of claim 1 wherein the deep-UV absorbing compound is bis-(N-(5-hydroxy-1-naphthyl) pyromellitic diimide.

9. The composition of claim 1 the deep-UV absorbing compound is 4,4'-(4,4'-isopropylidenediphenoxy)-bis-(-(4-carboxyphenyl)phthalimide).

10. The composition of claim 1 wherein the concentration of the polydimethylglutarimide resin is about 2 to about 20 weight percent of the solvent.

11. The composition of claim 1 wherein the deep UV absorbing additive is added in an amount of about 20% to about 55% by weight of the solids content of the composition.

12. A composite article comprising (1) a microelectronic substrate; (2) a layer of lift-off resist comprising a composition of claim 1 on top of the microelectronic substrates; and (3) a layer of positive-imaging photoresist on top of the layer of lift-off resist.

13. The composite article of claim 12 wherein the substrate is gallium arsenide, indium phosphide, silicon, silicon germanium or ceramic.

14. The composite article of claim 13 wherein an oxide, a nitride, a metal or an alloy is deposited upon the gallium arsenide, indium phosphide, silicon, silicon germanium or ceramic.

15. The composite article of claim 14 wherein the substrate is ceramic with a nickel-ion metal deposited thereon.

16. The composite article of claim 12 wherein the positive-imaging photoresist is a chemically amplified type.

17. The composite article of claim 12 wherein the layer of lift-off resist has a uniform thickness of about 250 to about 000 Angstroms.

18. The composite article of claim 12 wherein the layer of positive-imaging photoresist has a uniform thickness of about 0.5 to about 1.5 microns.

* * * * *